(12) United States Patent
Hiroshiro et al.

(10) Patent No.: US 11,306,249 B2
(45) Date of Patent: Apr. 19, 2022

(54) SUBSTRATE PROCESSING METHOD, SUBSTRATE PROCESSING DEVICE AND ETCHING LIQUID

(71) Applicant: Tokyo Electron Limited, Tokyo (JP)

(72) Inventors: Koukichi Hiroshiro, Koshi (JP); Tetsuya Sakazaki, Koshi (JP); Koji Kagawa, Koshi (JP); Kenji Sekiguchi, Koshi (JP); Kazuyoshi Mizumoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/965,776

(22) PCT Filed: Jan. 23, 2019

(86) PCT No.: PCT/JP2019/002141
§ 371 (c)(1),
(2) Date: Jul. 29, 2020

(87) PCT Pub. No.: WO2019/151090
PCT Pub. Date: Aug. 8, 2019

(65) Prior Publication Data
US 2021/0032537 A1 Feb. 4, 2021

(30) Foreign Application Priority Data

Jan. 30, 2018 (JP) .............................. JP2018-013985
Jun. 28, 2018 (JP) .............................. JP2018-122609

(51) Int. Cl.
*H01L 21/3213* (2006.01)
*H01L 21/311* (2006.01)
(Continued)

(52) U.S. Cl.
CPC ........ *C09K 13/08* (2013.01); *H01L 21/31111* (2013.01); *H01L 21/32134* (2013.01); *H01L 21/6708* (2013.01); *H01L 21/68764* (2013.01)

(58) Field of Classification Search
None
See application file for complete search history.

(56) References Cited

U.S. PATENT DOCUMENTS 4,087,367 A * 5/1978 Rioult ............... H01L 21/31111
252/79.1
10,163,623 B1 * 12/2018 Kelly ................ H01L 21/02123
(Continued)

FOREIGN PATENT DOCUMENTS

JP  S51-069369 A   6/1976
JP  2001-308058 A  11/2001
(Continued)

OTHER PUBLICATIONS

International Search Report for PCT/JP2019/002141 dated Apr. 23, 2019.

*Primary Examiner* — Shamim Ahmed
(74) *Attorney, Agent, or Firm* — Pearne & Gordon LLP

(57) ABSTRACT

A substrate processing method includes holding a substrate; and supplying an etching liquid to the substrate held in the holding of the substrate. The etching liquid contains an etching agent configured to etch a metal-based first material and a silicon-based second material exposed on the substrate and a protection agent configured to react with the second material between the first material and the second material to form a protection layer on a surface of the second material. Here, the etching agent is a liquid which contains fluorine atoms and an organic solvent and substantially does not contain water, and the protection layer protects the second material from etching with the etching agent.

12 Claims, 10 Drawing Sheets

(51) Int. Cl.
*C09K 13/08* (2006.01)
*H01L 21/67* (2006.01)
*H01L 21/687* (2006.01)

(56) References Cited

U.S. PATENT DOCUMENTS

| | | | |
|---|---|---|---|
| 2002/0197878 A1* | 12/2002 | Konishi | H01L 21/76802 |
| | | | 438/723 |
| 2007/0235684 A1* | 10/2007 | Mistkawi | H01L 21/32134 |
| | | | 252/79.1 |
| 2010/0267233 A1* | 10/2010 | Koide | H01L 21/02071 |
| | | | 438/669 |
| 2014/0290093 A1 | 10/2014 | Jung et al. | |
| 2016/0300711 A1* | 10/2016 | Rathsack | H01L 21/31144 |
| 2018/0033605 A1* | 2/2018 | Ota | H01L 21/67051 |

FOREIGN PATENT DOCUMENTS

| | | |
|---|---|---|
| JP | 3396030 B2 | 2/2003 |
| JP | 2003-164857 A | 6/2003 |
| JP | 2008-535249 A | 8/2008 |
| JP | 2009-527131 A | 7/2009 |
| JP | 2013-016798 A | 1/2013 |
| JP | 2013-103962 A | 5/2013 |
| WO | 2006/104670 A2 | 10/2006 |
| WO | 2007/117880 A1 | 10/2007 |

* cited by examiner

| SOLUTE | SOLVENT | HF | H$^+$ | F$^-$ | HF$_2^-$ |
|---|---|---|---|---|---|
| HF(50%) | H$_2$O | Rich | Rich | Rich | Rich |
| NH$_4$F$_{(s)}$ | | Avg | Rich | Rich | Avg |
| NH$_4$HF$_{2(s)}$ | | Avg | Avg | Avg | Avg |
| HF(50%) | IPA | Rich | Poor | Poor | Poor |
| NH$_4$F$_{(s)}$ | | Poor | Avg | Avg | Poor |
| NH$_4$HF$_{2(s)}$ | | Poor | Poor | Poor | Avg |

SUBSTRATE PROCESSING METHOD, SUBSTRATE PROCESSING DEVICE AND ETCHING LIQUID

CROSS-REFERENCE TO RELATED APPLICATION

This Application is a U.S. national phase application under 35 U.S.C. § 371 of PCT Application No. PCT/JP2019/002141 filed on Jan. 23, 2019, which claims the benefit of Japanese Patent Application Nos. 2018-013985 and 2018-122609 filed on Jan. 30, 2018 and Jun. 28, 2018, the entire disclosures of which are incorporated herein by reference.

TECHNICAL FIELD

The various embodiments described herein pertain generally to a substrate processing method, a substrate processing device and an etching liquid.

BACKGROUND ART

Conventionally, in a manufacturing process of a semiconductor device, wet etching may be performed on a surface of a substrate such as a silicon wafer or a compound semiconductor wafer.

PRIOR ART DOCUMENT

Patent Document 1: Japanese Patent No. 3,396,030

DISCLOSURE OF THE INVENTION

Problems to be Solved by the Invention

Means for Solving the Problems

In one exemplary embodiment, a substrate processing method includes holding a substrate; and supplying an etching liquid to the substrate held in the holding of the substrate, the etching liquid containing an etching agent configured to etch a metal-based first material and a silicon-based second material exposed on the substrate and a protection agent configured to react with the second material between the first material and the second material to form a protection layer on a surface of the second material, the etching agent being a liquid which contains fluorine atoms and an organic solvent and substantially does not contain water, and the protection layer protecting the second material from etching with the etching agent.

Effect of the Invention

DETAILED DESCRIPTION

Figure 1:
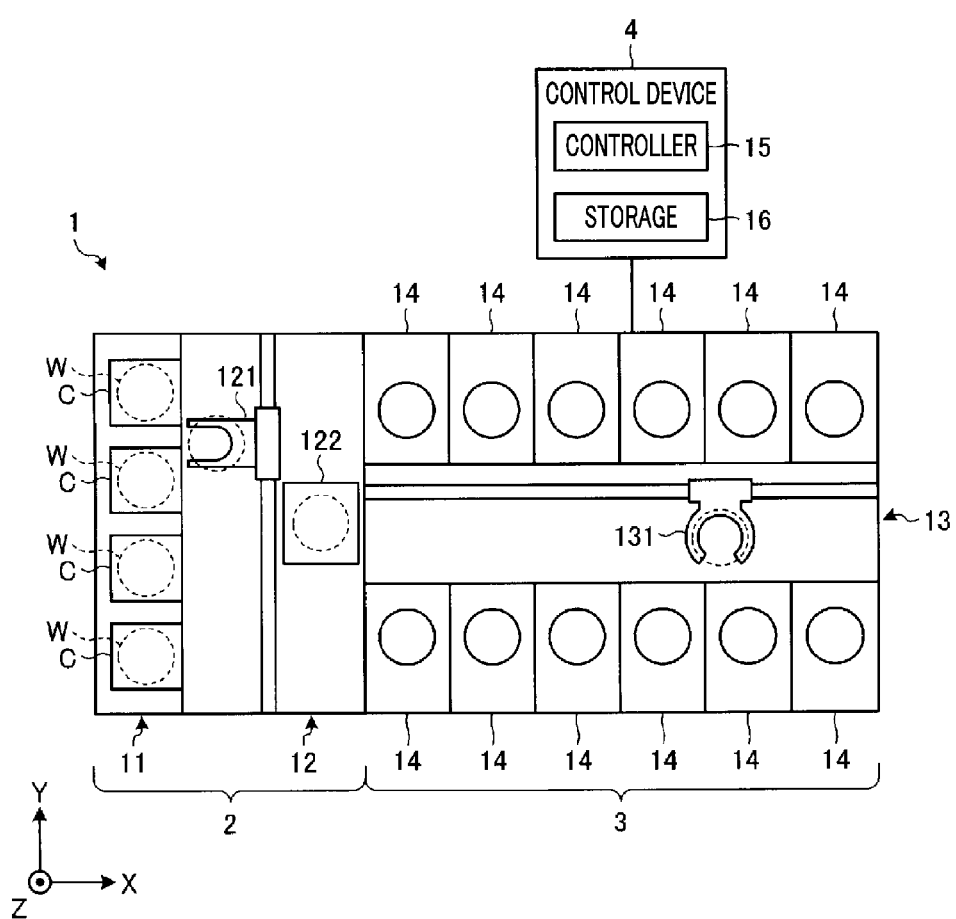
FIG. 1 is a schematic diagram illustrating a configuration of a substrate processing system according to an exemplary embodiment.

Hereinafter, embodiments (hereinafter, referred to as "exemplary embodiments") of a substrate processing method, a substrate processing device and an etching liquid according to the present disclosure will be described in detail with reference to the accompanying drawings. Further, the substrate processing method, the substrate processing device and the etching liquid of the present application are not limited to the following exemplary embodiments. Furthermore, the exemplary embodiments can be appropriately combined as long as processing contents are not contradictory to each other. Also, in each of the exemplary embodiments described below, same parts will be assigned same reference numerals, and redundant description will be omitted.

Patent Document 1 discloses a technique of adjusting an etching rate of a gate oxide film to be equal to or smaller than 10 Å/min by using, as an etching liquid, an ammonium fluoride solution in which ammonium fluoride is dissolved in a low dielectric constant solvent, e.g., acetic acid or tetrahydrofuran. According to this technique, it is possible to remove metal-based sub-products formed on side walls of a gate electrode while suppressing the gate oxide film from being etched.

However, according to the technique described in Patent Document 1, a material, e.g., a silicon oxide film, which needs to be left on a substrate as well as the metal-based sub-products can be removed by the ammonium fluoride solution. Therefore, a technique capable of improving the selectivity of wet etching has been expected.

1. CONFIGURATION OF SUBSTRATE PROCESSING SYSTEM

Figure 2:
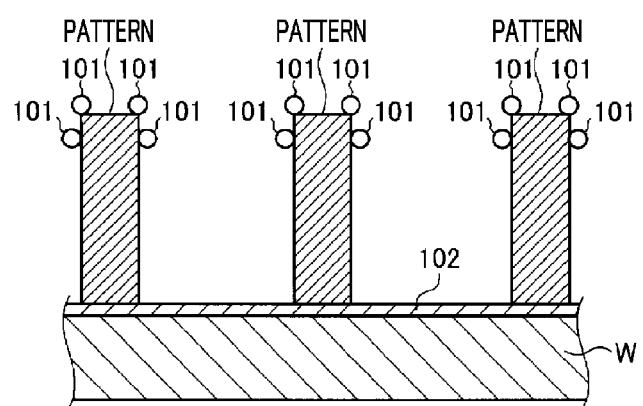
FIG. 2 is a schematic view of a wafer according to the exemplary embodiment.

First, a configuration of a substrate processing system according to an exemplary embodiment will be described. FIG. 1 is a schematic diagram illustrating the configuration of the substrate processing system according to the exemplary embodiment. Also, FIG. 2 is a schematic view of a wafer according to the exemplary embodiment. Further, in the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is equipped with a carrier placing section 11 and a transfer section 12. In the carrier placing section 11, a plurality of transfer containers (hereinafter, referred as "carriers C") is placed to accommodate a plurality of wafers W horizontally.

The transfer section 12 is provided adjacent to the carrier placing section 11. The transfer section 12 is equipped with a substrate transfer device 121 and a delivery unit 122 therein.

The substrate transfer device 121 is equipped with a wafer holding mechanism configured to hold a wafer W. Further, the substrate transfer device 121 is movable horizontally and vertically and pivotable around a vertical axis. The substrate transfer device 121 transfers the wafer W between the carrier C and the delivery unit 122 by the wafer holding mechanism.

The processing station 3 is provided adjacent to the transfer section 12. The processing station 3 is equipped with a transfer section 13 and a plurality of substrate processing devices 14. The plurality of substrate processing devices 14 may be arranged on both sides of the transfer section 13.

The transfer section 13 is equipped with a substrate transfer device 131 therein. The substrate transfer device 131 is equipped with a wafer holding mechanism configured to hold the wafer W. Further, the substrate transfer device 131 is movable horizontally and vertically and pivotable around a vertical axis. The substrate transfer device 131 transfers the wafer W between the delivery unit 122 and the substrate processing device 14 by the wafer holding mechanism.

The substrate processing device 14 performs a wet etching processing (hereinafter, simply referred to as "etching processing"). The etching processing is performed to remove a reaction product generated during, for example, dry etching. Further, the etching processing may be performed to remove a material, such as copper, which is difficult to remove by the dry etching.

As illustrated in FIG. 2, the wafer W according to the exemplary embodiment is a silicon wafer, a compound semiconductor wafer or the like, and a first material 101, which is an etching target, and a second material 102, which is a non-etching target, are exposed on a surface of the wafer W.

The first material 101 is composed of a metal-based material. The metal-based material may include a metal, a metal oxide, and other metal-containing materials.

For example, the first material 101 is a metal-based reaction product generated by the dry etching. Although FIG. 2 illustrates an example where the first material 101 adheres to an upper portion of a pattern, the first material 101 may adhere to any place other than the upper portion of the pattern. For example, the first material 101 may adhere on the second material 102.

The second material 102 is composed of a silicon-based material. For example, the second material 102 is a silicon-based film such as a silicon oxide film, a silicon thermal oxide film, a silicon nitride film, a silicon oxynitride film or the like. Although FIG. 2 illustrates an example where the second material 102 is exposed on a bottom surface of a recess of the pattern, the second material 102 may be exposed on any place other than the bottom surface of the recess of the pattern.

The first material 101 can be removed with a fluorine-based etching liquid such as a hydrogen fluoride solution, an ammonium fluoride solution or an ammonium hydrogen fluoride solution. However, the fluorine-based etching liquid can also remove the second material 102 which is composed of the silicon-based material.

Therefore, the substrate processing device 14 according to the exemplary embodiment of the present disclosure performs the etching processing on the wafer W with an etching liquid prepared by adding a protection agent, which reacts with the second material 102 but does not react with the first material 101, into a fluorine-based etching agent. The composition of the etching liquid will be described in detail later.

The substrate processing system 1 is equipped with a control device 4. The control device 4 controls the operations of the substrate processing system 1. The control device 4 is, for example, a computer and includes a controller 15 and a storage 16. The storage 16 stores programs that control various processings such as etching processing. The controller 15 controls the operations of the substrate processing system 1 by reading and executing the program stored in the storage 16. The controller 15 is, for example, a central processing unit (CPU) or a microprocessor unit (MPU), and the storage 16 is, for example, a read only memory (ROM) or a random access memory (RAM).

Further, the program may be stored in a computer-readable recording medium, and installed from the recording medium to the storage 16 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 121 of the carry-in/out station 2 first takes out the wafer W from the carrier C and then places the taken wafer W on the delivery unit 122. The wafer W placed on the delivery unit 122 is taken out from the delivery unit 122 by the substrate transfer device 131 of the processing station 3 and carried into the substrate processing device 14. The wafer W carried into the substrate processing device 14 is etched by the substrate processing device 14 and then carried out from the substrate processing device 14 to be placed on the delivery unit 122 by the substrate transfer device 131. Thereafter, the wafer W is returned to the carrier C by the substrate transfer device 121.

2. CONFIGURATION OF SUBSTRATE PROCESSING DEVICE

Figure 3:
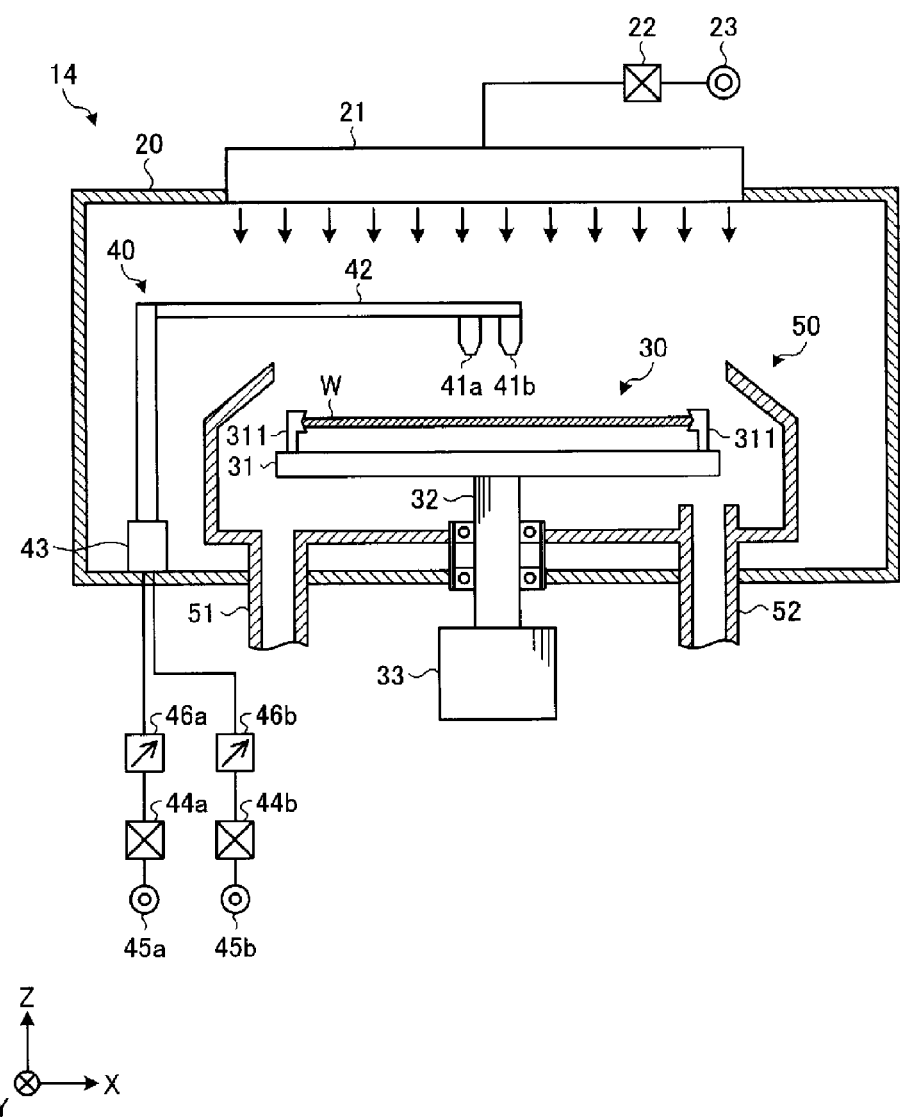
FIG. 3 is a schematic diagram illustrating a configuration of a substrate processing device according to the exemplary embodiment.

Hereinafter, the configuration of the substrate processing device 14 will be described with reference to FIG. 3. FIG. 3 is a schematic diagram illustrating the configuration of the substrate processing device 14 according to the exemplary embodiment.

As illustrated in FIG. 3, the substrate processing device 14 is equipped with a chamber 20, a substrate holding mechanism 30, a liquid supply 40 and a recovery cup 50.

The chamber 20 accommodates therein the substrate holding mechanism 30, the liquid supply 40 and the recovery cup 50. A fan filter unit (FFU) 21 is provided on a ceiling portion of the chamber 20. The FFU 21 forms a downflow inside the chamber 20.

The FFU 21 is connected to a downflow gas source 23 via a valve 22. The FFU 21 discharges a downflow gas (for example, dry air) supplied from the downflow gas source 23 into the chamber 20.

The substrate holding mechanism 30 is equipped with a rotation holder 31, a support 32 and a driver 33. The rotation holder 31 is provided in an approximately central part of the chamber 20. On the rotation holder 31, holding members 311 configured to hold the wafer W from the side thereof are provided. The wafer W is held horizontally by the holding members 311 above the rotation holder 31 with a small space from the rotation holder 31.

The support 32 is a member extending vertically. A base end portion of the support 32 is rotatably supported by the driver 33 and a tip end portion of the support 32 supports the rotation holder 31 horizontally. The driver 33 rotates the support 32 around a vertical axis.

By rotating the support 32 with the driver 33, the substrate holding mechanism 30 rotates the rotation holder 31 supported by the support 32 and thus rotates the wafer W held by the rotation holder 31.

Further, the rotation holder 31 has a type of holding the wafer W from the side thereof, but is not limited thereto. For example, the rotation holder 31 may suck and hold the wafer W from its bottom side like a vacuum chuck.

The liquid supply 40 is configured to supply various processing liquids to the wafer W held by the substrate holding mechanism 30. The liquid supply 40 is equipped with a plurality of (herein, two) nozzles 41a and 41b, an arm 42 configured to hold the nozzles 41a and 41b horizontally and a pivotable elevation mechanism 43 configured to pivot and elevate the arm 42. The nozzle 41a and the nozzle 41b may be supported by different arms, respectively.

The nozzle 41a is connected to an etching liquid source 45a via a valve 44a and a flow rate controller 46a. Also, the nozzle 41b is connected to a rinse liquid source 45b via a valve 44b and a flow rate controller 46b.

An etching liquid supplied from the etching liquid source 45a is discharged from the nozzle 41a. Details of the etching liquid will be described later.

A rinse liquid supplied from the rinse liquid source 45b is discharged from the nozzle 41b. The rinse liquid is, for example, deionized water (DIW).

The recovery cup 50 is disposed to surround the rotation holder 31 and collects the processing liquid scattered from the wafer W by the rotation of the rotation holder 31. A drain port 51 is formed on a bottom of the recovery cup 50, and the processing liquid collected by the recovery cup 50 is drained from the drain port 51 to the outside of the substrate processing device 14. Further, an exhaust port 52 is formed on the bottom of the recovery cup 50 to discharge the downflow gas supplied from the FFU 21 to the outside of substrate processing device 14.

Furthermore, the number of nozzles provided in the substrate processing device 14 is not limited to the above-described example. For example, the substrate processing device 14 may be equipped with a single nozzle for discharging the etching liquid and the rinse liquid.

3. ETCHING LIQUID

The etching liquid according to the exemplary embodiment contains an "etching agent" and a "protection agent".

The "etching agent" is a fluorine-based chemical liquid configured to etch the first material 101, which is an etching target, among a plurality of materials exposed on the wafer W. However, the "etching agent" is also configured to etch the second material 102, which is a non-etching target, as well as the first material 101.

Therefore, the etching liquid according to the exemplary embodiment contains "protection agent". The "protection agent" is a chemical which reacts with the second material 102 between the first material 101 and the second material 102 to form a protection layer on the surface of the second material 102. With the etching liquid according to the exemplary embodiment, the protection agent can protect the surface of the second material 102, and, thus, it is possible to suppress etching of the second material 102 with the etching agent while etching the first material 101. Therefore, with the etching liquid according to the exemplary embodiment, it is possible to improve the selectivity between the first material 101 and the second material 102.

Hereinafter, the "etching agent" and the "protection agent" contained in the etching liquid according to the exemplary embodiment will be described in detail.

3-1. Etching Agent

The etching agent according to the exemplary embodiment is a liquid which contains fluorine atoms and an organic solvent and substantially does not contain water. The etching agent used herein may be a solution containing any one of hydrogen fluoride (HF), ammonium hydrogen fluoride ($NH_4HF_2$), and ammonium fluoride ($NH_4F$) as a solute and any one of isopropyl alcohol (IPA), methanol and ethanol as a solvent.

The solute just needs to be a material containing at least a fluorine atom and is not limited to HF, $NH_4HF_2$ and $NH_4F$. Also, the solvent just needs to be an organic solvent and is not limited to IPA, methanol and ethanol.

Further, the term "substantially does not contain water" means that water is not actively contained but water which is inevitably mixed such as a minute amount of water contained in a solute or a solvent is allowed. Specifically, the term "substantially does not contain water" means that water is not contained at all or if water is contained, the content of water is equal to "1.0 wt % or less".

Figures 4, 5:
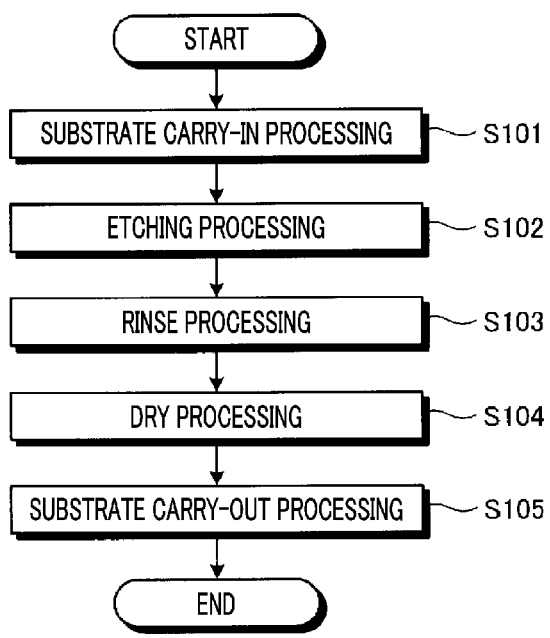
FIG. 4 is a table showing a relationship between solute and solvent combinations in an etching agent and an etchant.
FIG. 5 is a flowchart illustrating a sequence of processings performed by the substrate processing system according to the exemplary embodiment.

FIG. 4 is a table showing the relationship between combinations of the solute and the solvent in the etching agent and an etchant. FIG. 4 shows six types of etching agents. Specifically, there are three types of etching agents containing HF, $NH_4F$ and $NH_4HF_2$, respectively, as the solute and $H_2O$ as the solvent, and there are other three types of etching agents containing HF, $NH_4F$ and $NH_4HF_2$, respectively, as the solute and isopropyl alcohol (IPA) as the solvent. In FIG. 4, "(50%)" indicates that the concentration is 50%, and "(s)" indicates a saturated aqueous solution. Also, in FIG. 4, the amount of the etchant is expressed in three levels as "Rich", "Avg" and "Poor" in this order from the largest.

As shown in FIG. 4, it can be seen that when water ($H_2O$) is used as the solvent, a plurality of types of etchants, specifically HF, $H^+$, $F^-$ and $HF_2^-$, exists in each etching agent. This is because water has a high relative dielectric constant and undergoes various ionizations (first ionization, second ionization, etc.) due to chemical equilibrium, resulting in an equilibrium state. The plurality of types of etchants may include not only an etchant which etches the etching target but also an etchant which etches the non-etching target. Therefore, it is difficult to perform selective etching.

Also, it can be seen that when IPA is used as the solvent, only HF exists as the etchant for the etching agent containing HF as the solute and only $H^+$ and $F^-$ exist for $NH_4F$ and only $HF_2^-$ exists for $NH_4HF_2$. This is because IPA has a lower relative dielectric constant than water, and, thus, ionization of ammonium hydrogen fluoride (NH$_4$HF$_2$) or ammonium fluoride (NH$_4$F) is suppressed. For example, in the etching agent containing HF as the solute and IPA as the solvent, H$^+$ or F$^-$ cannot exist but only HF, which is a neutral molecule, exists in IPA.

Combinations of the solute and the solvent can be appropriately selected according to the etching target. For example, in the etching agent containing NH$_4$HF$_2$ as the solute and methanol as the solvent, only first ionization occurs, and, thus, and only HF$_2^-$, which is an etchant of SiO$_2$, can be generated. As a result, for example, a thermal oxide film known to be dense and have a low etching rate can be etched at a higher etching rate than aluminum oxide (AlO). Further, in the etching agent containing NH$_4$F as the solute and methanol as the solvent, only the first ionization occurs, and, thus, HF$_2^-$, which is an etchant of SiO$_2$, is not generated. Therefore, it is possible to suppress etching of SiO$_2$.

Desirably, a material having a relative dielectric constant of 40 or less is used as the organic solvent. The relative dielectric constant of methanol is 32.7, the relative dielectric constant of ethanol is 26.4, and the relative dielectric constant of IPA is 19.9. The etching agent can be obtained by dissolving a salt such as NH$_4$HF$_2$ or NH$_4$F in the organic solvent. The etching agent is not limited to salt and can be obtained by dissolving, for example, an HF gas in the organic solvent.

As described above, by using the organic solvent which substantially does not contain water having a high relative dielectric constant and has a lower relative dielectric constant than water, the type of etchant can be limited. Thus, the etching selectivity can be improved. The etching liquid according to the exemplary embodiment further contains the protection agent and thus further improves the etching selectivity.

3-2. Protection Agent

The protection agent is a chemical which reacts with the silicon-based material to form the protection layer on the surface of the silicon-based material. For example, a silylating agent may be used as the protection agent. The silylating agent is configured to react with and adsorb an Si-containing dielectric material or an Si surface.

Specifically, the protection agent is a chemical represented by the following Chemical Formula 1:

[Chemical Formula 1]

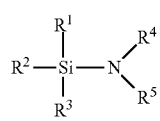
(1)

In the above Chemical Formula 1, R$^1$ to R$^5$ each independently represents an alkyl group substituted with a halogen or an unsubstituted alkyl group. The alkyl group is, for example, an alkyl group having a carbon number of 1 to 8. Examples of the protection agent having the structure represented by Chemical Formula 1 include trimethylsilyl dimethylamine (TMSDMA) and butyldimethylsilyl dimethylamine (BDMSDMA). Also, examples of the protection agent having the structure represented by Chemical Formula 1 include triethylsilyl dimethylamine (TESDMA) and nanofluorohexyl dimethyl(dimethylamine)silane (NFHDMA).

Also, the protection agent may be a chemical represented by the following Chemical Formula 2:

[Chemical Formula 2]

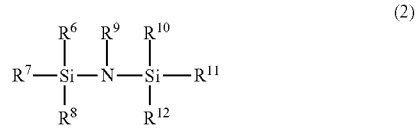
(2)

In the above Chemical Formula 2, R$^6$ to R$^{12}$ each independently represents an alkyl group or a hydrogen atom. The alkyl group is, for example, an alkyl group having a carbon number of 1 to 8. Examples of the protection agent having the structure represented by Chemical Formula 2 include hexamethyldisilazane (HMDS).

Further, the protection agent may be a chemical represented by the following Chemical Formula 3:

[Chemical Formula 3]

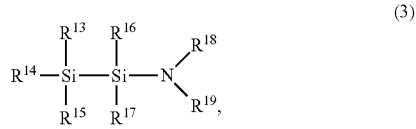
(3)

In the above Chemical Formula 3, R$^{13}$ to R$^{19}$ each independently represents an alkyl group. The alkyl group is, for example, an alkyl group having a carbon number of 1 to 8. Examples of the protection agent having the structure represented by Chemical Formula 3 include N, N-dimethylamino pentamethyldisilane (DMAPMDS).

All of these protection agents having the structures represented by Chemical Formulas 1 to 3 have a direct bond between a silicon atom and a nitrogen atom. The direct bond between the silicon atom and the nitrogen atom is broken in the organic solvent as the solvent and then separated into a silicon atom-side molecule and a nitrogen atom-side molecule. Then, the silicon atom-side molecule (e.g., as for TMSDMA, trimethylsilane (—Si(CH$_3$)$_3$)) is adsorbed on the surface of the silicon-based material, i.e., is bonded to the silicon atom present on the surface of the silicon-based material. Thus, a dangling bond of the silicon atom present on the surface of the silicon-based material is filled, so that an etchant (e.g., HF$_2^-$) of the silicon-based material is hardly adsorbed. Therefore, the etching of the silicon-based material with the etching agent can be suppressed.

In addition, some chemicals that do not have the direct bond between the silicon atom and the nitrogen atom, such as a silane coupling agent, may be adsorbed on the surface of the silicon-based material. However, for example, if the a silane coupling agent is used as the protection agent, the silane coupling agent needs to be bonded to water in order to generate molecules that are adsorbed on the surface of the silicon-based material. For this reason, if the silane coupling agent is applied to the etching liquid which substantially does not contain water, for example, a drying process is needed. Meanwhile, since the direct bond between the silicon atom and the nitrogen atom is broken in the organic solvent, it is suitable for the application to the etching liquid which substantially does not contain water.

In addition, the protection agent, which is the silylating agent, reacts with the silicon-based material but hardly reacts with the metal-based material. In this regard, the present inventors conducted an experiment in which TMSDMA, which is the silylating agent, is supplied to the metal-based material and the silicon-based material and a change in contact angle before and after the supply of TMSDMA is examined. Examples of the metal-based material include Al, Co, CoPt, Cu, $Al_2O_3$ and the like. Also, examples of the silicon-based material include bare silicon, a thermal oxide film, SiON, SiN, spin-on glass, an interlayer insulating film and the like. As a result, it is observed that as for the silicon-based material, the contact angle is changed greatly after the supply of TMSDMA (increased to 90° or more in all the silicon-based materials), whereas as for the metal-based material, the contact angle is changed rarely. It can be seen from this result that the protection agent, which is the silylating agent, reacts with the silicon-based material but hardly reacts with the metal-based material.

As such, by using the silylating agent as the protection agent, the etching of the silicon-based material can be suppressed without inhibiting the etching of the metal-based material. Therefore, the etching liquid according to the exemplary embodiment can be appropriately used to etch the metal-based material but not to etch the silicon-based material on the substrate where the metal-based material (first material 101) and the silicon-based material (second material 102) are exposed on the surface.

In addition, when the content of the protection agent is too high, the etching rate of the metal-based material, which is the etching target, may decrease. For this reason, the molar content of the protection agent in the etching liquid is desirably 5.0 times or less and more desirably 3.0 times or less than that of the etching agent.

4. SPECIFIC OPERATIONS OF SUBSTRATE PROCESSING SYSTEM

Hereinafter, specific operations of the substrate processing device 14 will be described with reference to FIG. 5. FIG. 5 is a flowchart illustrating a sequence of processings performed by the substrate processing system 1 according to the exemplary embodiment. The devices included in the substrate processing system 1 perform the respective processings according to the sequence illustrated in FIG. 5 under the control of the controller 15.

As illustrated in FIG. 5, in the substrate processing device 14, a substrate carry-in processing is performed first (process S101). In the substrate carry-in processing, the wafer W carried into the chamber 20 by the substrate transfer device 131 (see FIG. 1) is held by the holding member 311 of the substrate holding mechanism 30. The wafer W is held by the holding member 311 with the pattern forming surface thereof facing upwards. Thereafter, the rotation holder 31 is rotated by the driver 33. Thus, the wafer W rotates together with the rotation holder 31 while being held horizontally by the rotation holder 31. The rotation number of the wafer W is set to a first rotation number.

Then, the substrate processing device 14 performs an etching processing with the above-described etching liquid (process S102). In the etching processing, the nozzle 41a of the liquid supply 40 is located above the center of the wafer W. Thereafter, the valve 44a is opened for a predetermined time period and the etching liquid is supplied to the pattern forming surface of the wafer W.

The etching liquid supplied to the wafer W spreads on the surface of the wafer W due to a centrifugal force caused by the rotation of the wafer W. Thus, the first material 101 (see FIG. 2) exposed on the surface of the wafer W is etched with the etching agent contained in the etching liquid. Further, the protection agent contained in the etching liquid reacts with the second material 102 to form the protection layer on the surface of the second material 102, and, thus, it is possible to suppress the etching of the second material 102 with the etching agent. Therefore, it is possible to etch the first material 101, which is the etching target, while suppressing the etching of the second material 102, which is the non-etching target.

Subsequently, the substrate processing device 14 performs a rinse processing (process S103). In the rinse processing, the nozzle 41b of the liquid supply 40 is located above the center of the wafer W. Thereafter, a valve 44c is opened fora predetermined time period and DIW, which is the rinse liquid, is supplied to the wafer W. The DIW supplied to the wafer W spreads on the pattern forming surface of the wafer W due to the centrifugal force caused by the rotation of the wafer W. As a result, the etching liquid remaining on the wafer W is washed away by the DIW.

Subsequently, the substrate processing device 14 performs a dry processing (process S104). In the dry processing, for example, by increasing the rotation number of the wafer W from the first rotation number to a second rotation number, the DIW remaining on the surface of the wafer W is shaken off to dry the wafer W.

Then, the substrate processing device 14 performs a substrate carry-out processing (process S105). In the substrate carry-out processing, the wafer W is taken out from the chamber 20 of the substrate processing device 14 by the substrate transfer device 131 (see FIG. 1). Thereafter, the wafer W is accommodated in the carrier C placed on the carrier placing section 11 via the delivery unit 122 and the substrate transfer device 121. When the substrate carry-out processing is completed, the processing for one wafer W is completed.

As described above, the substrate processing device 14 according to the exemplary embodiment includes the substrate holding mechanism 30 (an example of a holder) and the liquid supply 40 (an example of a supply). The substrate holding mechanism 30 holds the wafer W (an example of a substrate). The liquid supply 40 supplies the etching liquid to the wafer W held by the substrate holding mechanism 30. The etching liquid contains the etching agent which etches the metal-based first material 101 and the silicon-based second material 102 exposed on the wafer W; and the protection agent which reacts with the second material 102 between the first material 101 and the second material 102 to form the protection layer on the surface of the second material 102. The etching agent is the liquid which contains fluorine atoms and the organic solvent and substantially does not contain water. The protection layer protects the second material from etching with the etching agent.

Therefore, the substrate processing device 14 according to the exemplary embodiment can improve the selectivity of the wet etching.

5. MODIFICATION EXAMPLES

First Modification Example

In the above-described exemplary embodiment, there has been described the example where the etching liquid in which the etching agent and the protection agent are previously mixed is supplied to the liquid supply 40. However, the etching agent and the protection agent may be mixed immediately before being supplied to the wafer W. Thus, it is possible to suppress the degradation of the etching liquid which occurs after the etching agent and the protection agent are reacted with each other.

Figure 6:
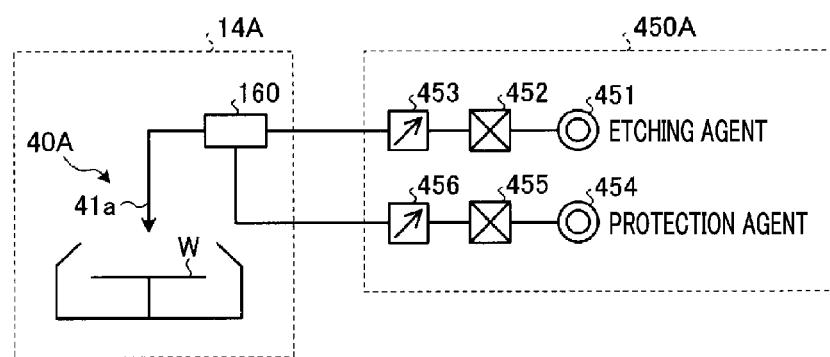
FIG. 6 is a diagram illustrating a configuration of a substrate processing device according to a first modification example.

FIG. 6 is a diagram illustrating a configuration of a substrate processing device according to a first modification example. In FIG. 6, the configuration of the rinse liquid supply system is appropriately omitted. Also, in the following description, the same components as described above will be denoted by like reference numerals and redundant descriptions thereof will be omitted.

As illustrated in FIG. 6, an etching liquid supply system 450A according to the first modification example includes an etching agent source 451, a first valve 452, a first flow rate controller 453, a protection agent source 454, a second valve 455 and a second flow rate controller 456.

Also, a substrate processing device 14A according to the first modification example includes a mixing unit 160. The mixing unit 160 is configured to generate the etching liquid by mixing the etching agent supplied from the etching agent source 451 at a predetermined flow rate with the protection agent supplied from the protection agent source 454 at a predetermined flow rate at a predetermined mixing ratio while maintaining the flow rates.

The mixing unit 160 is placed inside the chamber 20 (see FIG. 3) of the substrate processing device 14A. For example, the mixing unit 160 may be provided on the arm 42 of a liquid supply 40A.

In the etching processing according to the first modification example, the first valve 452 is opened for a predetermined time period and the second valve 455 is opened for a predetermined time period. Thus, the etching agent and the protection agent are supplied into the mixing unit 160 while maintaining the flow rates thereof to be mixed in the mixing unit 160. The mixing ratio between the etching agent and the protection agent is adjusted to a predetermined mixing ratio by the first flow rate controller 453 and the second flow rate controller 456.

Thereafter, the etching liquid generated in the mixing unit 160 is discharged from the nozzle 41a onto the surface of the wafer W. The etching liquid discharged onto the surface of the wafer W spreads on the wafer W due to the centrifugal force caused by the rotation of the wafer W. Thus, the first material 101 exposed on the surface of the wafer W is etched.

As described above, the substrate processing device 14A may mix the etching agent supplied from the etching agent source 451 and the protection agent supplied from the protection agent source 454 while maintaining the flow rates thereof.

Second Modification Example

Figure 7:
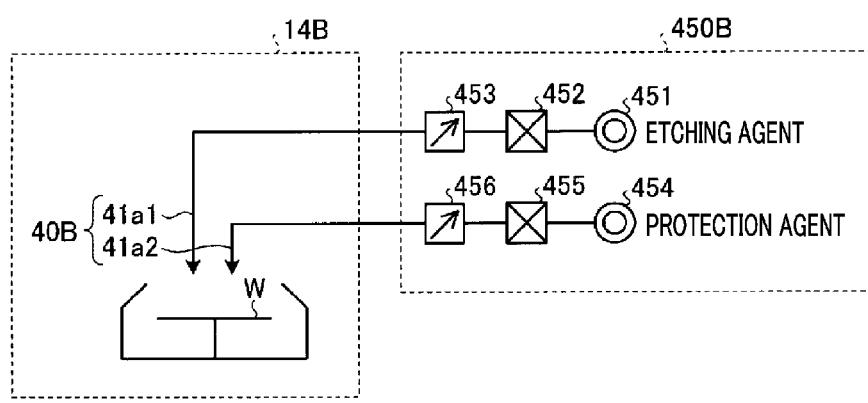
FIG. 7 is a diagram illustrating a configuration of a substrate processing device according to a second modification example.

The etching agent and the protection agent may be mixed on the wafer W. FIG. 7 is a diagram illustrating a configuration of a substrate processing device according to a second modification example. In FIG. 7, the configuration of the rinse liquid supply system is appropriately omitted, as in FIG. 6.

As illustrated in FIG. 7, an etching liquid supply system 450B according to the second modification example includes the etching agent source 451, the first valve 452, the first flow rate controller 453, the protection agent source 454, the second valve 455 and the second flow rate controller 456.

Also, a substrate processing device 14B according to the second modification example includes a liquid supply 40B. The liquid supply 40B includes a first nozzle 41a1 and a second nozzle 41a2. The first nozzle 41a1 is connected to the etching agent source 451 via the first valve 452 and the first flow rate controller 453, and discharges the etching agent supplied from the etching agent source 451 to the wafer W. The second nozzle 41a2 is connected to the protection agent source 454 via the second valve 455 and the second flow rate controller 456, and discharges the protection agent supplied from the protection agent source 454 to the wafer W.

In the etching processing according to the second modification example, the first valve 452 is opened for a predetermined time period and the second valve 455 is opened for a predetermined time period. Thus, the etching agent is supplied from the etching agent source 451 to the first nozzle 41a1, and the protection agent is supplied from the protection agent source 454 to the second nozzle 41a2. Then, the etching agent is discharged from the first nozzle 41a1 onto the surface of the wafer W, and the protection agent is discharged from the second nozzle 41a2 onto the surface of the wafer W. As a result, the etching agent and the protection agent are mixed on the wafer W to generate the etching liquid. The generated etching liquid spreads on the wafer W due to the centrifugal force caused by the rotation of the wafer W. Thus, the first material 101 exposed on the surface of the wafer W is etched.

As described above, the etching agent and the protection agent may be mixed on the wafer W. Herein, there has been described an example where the etching agent and the protection agent are simultaneously supplied onto the wafer W, but either the etching agent or the protection agent may be supplied to the wafer W earlier than the other.

Third Modification Example

Figure 8:
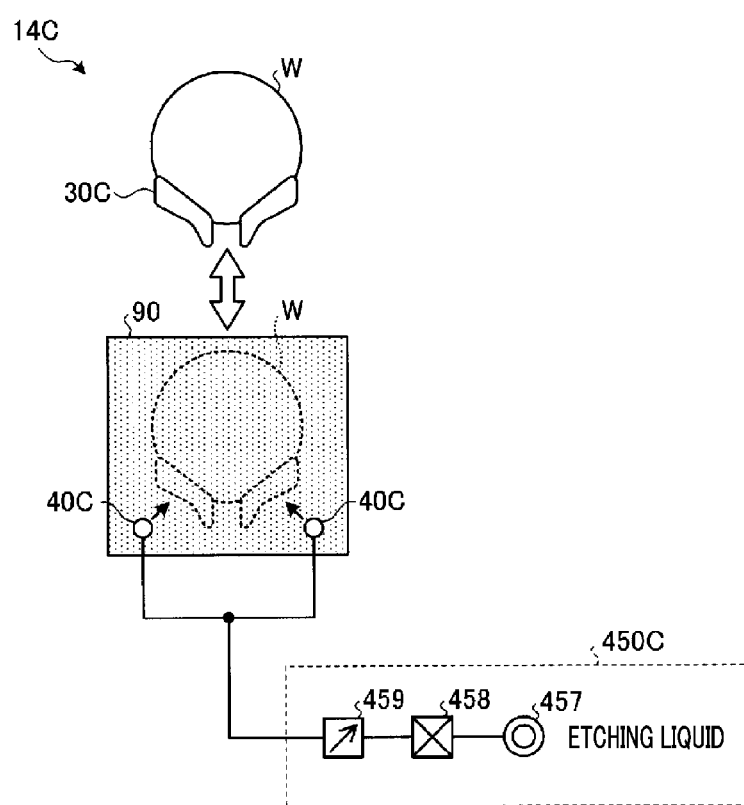
FIG. 8 is a diagram illustrating a configuration of a substrate processing device according to a third modification example.

In the above-described exemplary embodiment and medication examples, there has been described the example the etching liquid is used in a single-wafer type etching. However, the etching liquid may be used in a batch type etching for collectively processing a plurality of wafers W. Hereinafter, an example of a substrate processing device configured to perform the batch type etching will be described with reference to FIG. 8. FIG. 8 is a diagram illustrating a configuration of a substrate processing device according to a third modification example.

As illustrated in FIG. 8, an etching liquid supply system 450C according to the third modification example includes an etching liquid source 457, a valve 458 and a flow rate controller 459.

Also, a substrate processing device 14C according to the third modification example includes a processing tank 90, a substrate holding mechanism 30C and a liquid supply 40C.

The processing tank 90 stores an etching liquid therein. The substrate holding mechanism 30C collectively holds a plurality of wafers W in a vertical posture. The substrate holding mechanism 30C can be moved up and down by a non-illustrated elevation mechanism. The liquid supply 40C is connected to the etching liquid source 457 via the valve 458 and the flow rate controller 459, and is configured to supply the etching liquid into the processing tank 90. As a result, the processing tank 90 stores the etching liquid therein.

In the etching processing according to the third modification example, the substrate holding mechanism 30C is moved down to immerse the plurality of wafers W held by the substrate holding mechanism 30C in the etching liquid stored in the processing tank 90. Thus, the first material 101 exposed on the surfaces of the wafers W is etched.

As described above, the etching liquid can also be applied to the batch type etching for collectively processing the wafers W.

Fourth Modification Example

Figure 9:
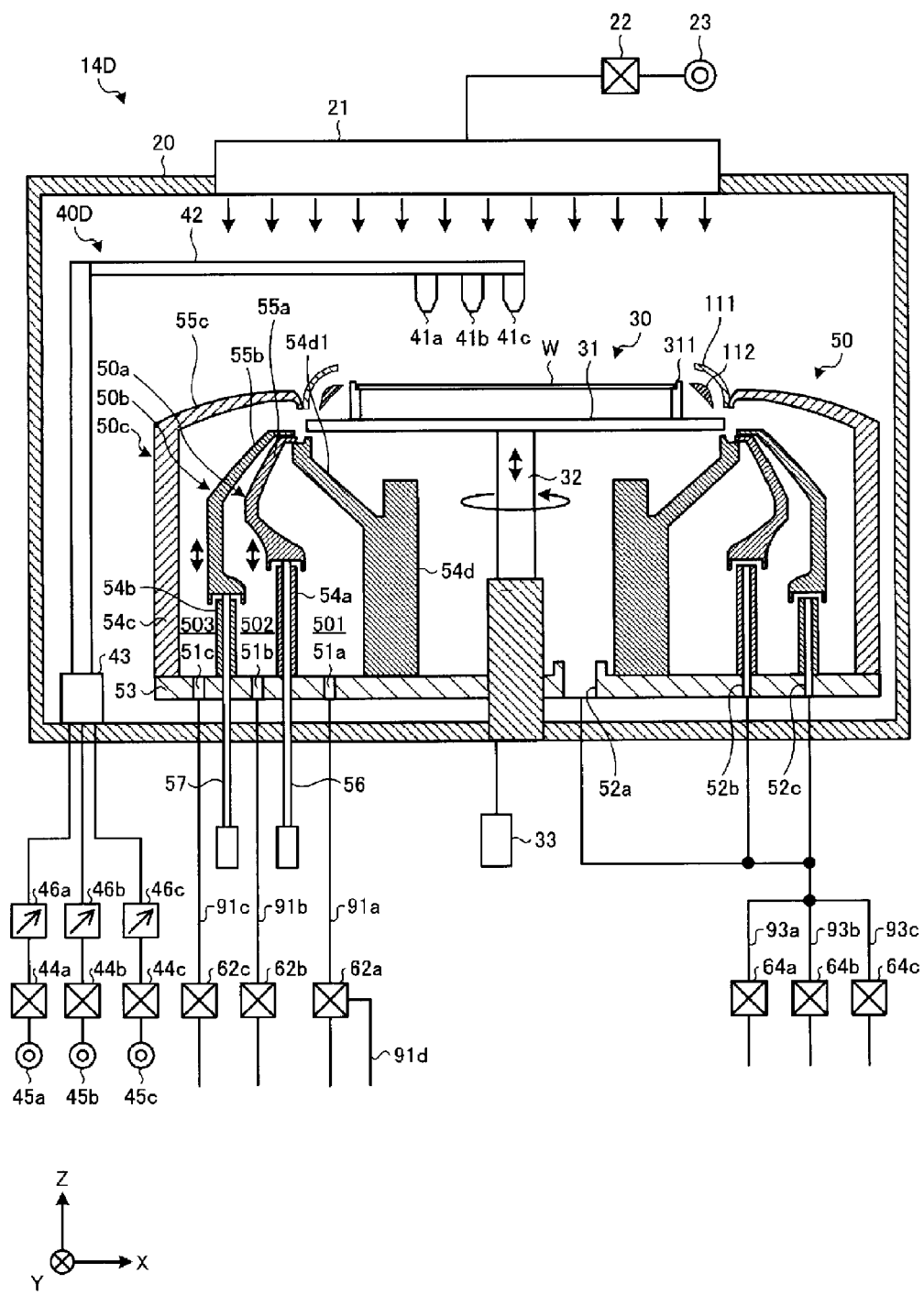
FIG. 9 is a diagram illustrating a configuration of a substrate processing device according to a fourth modification example.

Hereinafter, a configuration of a substrate processing device according to a fourth modification example will be described with reference to FIG. 9. FIG. 9 is a diagram illustrating the configuration of the substrate processing device according to the fourth modification example.

As illustrated in FIG. 9, a substrate processing device 14D according to the fourth modification example includes a liquid supply 40D. The liquid supply 40D includes nozzles 41a to 41c, an arm 42 configured to hold the nozzles 41a to 41c horizontally and a pivotable elevation mechanism 43 configured to pivot and elevate the arm 42.

The nozzle 41a is connected to the etching liquid source 45a, and the valve 44a and the flow rate controller 46a are provided between the etching liquid source 45a and the nozzle 41a. Also, the nozzle 41b is connected to the rinse liquid source 45b, and the valve 44b and the flow rate controller 46b are provided between the rinse liquid source 45b and the nozzle 41b. Further, the nozzle 41c is connected to an organic processing liquid source 45c, and the valve 44c and a flow rate controller 46c are provided between the organic processing liquid source 45c and the nozzle 41c.

The organic processing liquid source 45c is configured to supply an organic solvent to be contained in the etching agent of the etching liquid. The organic solvent supplied from the organic processing liquid source 45c is used in a line cleaning processing and a dry processing which will be described later.

In the fourth modification example, an organic solvent having a lower boiling point than water is used. Examples of the organic solvent may include ethanol, methanol, IPA, and the like.

First and second rotary cups 111 and 112 configured to rotate integrally with the rotation holder 31 are provided at a peripheral portion of the rotation holder 31. As illustrated in FIG. 9, the second rotary cup 112 is placed inside the first rotary cup 111.

Each of the first rotary cup 111 and the second rotary cup 112 is formed into a ring shape as a whole. The first and second rotary cups 111 and 112 rotate together with the rotation holder 31 and guide the processing liquid scattered from the wafer W being rotated to the recovery cup 50.

The recovery cup 50 includes a first cup 50a, a second cup 50b and a third cup 50c in this order from the inner side near the rotation center of the wafer W. Further, the recovery cup 50 includes a cylindrical inner wall member 54d centering on the rotation center of the wafer W at an inner circumferential side of the first cup 50a.

The first to third cups 50a to 50c and the inner wall member 54d are provided on a bottom portion 53 of the recovery cup 50.

The first cup 50a includes a first circumferential wall member 54a and a first liquid receiving member 55a. The first circumferential wall member 54a stands up from the bottom portion 53 and is formed into a barrel shape (for example, a cylindrical shape). A space is formed between the first circumferential wall member 54a and the inner wall member 54d, and this space serves as a first drain groove 501 for recovering and discharging the processing liquid and the like. The first liquid receiving member 55a is provided above an upper surface of the first circumferential wall member 54a.

The first cup 50a includes a first elevation mechanism 56 and is configured to be movable up and down by the first elevation mechanism 56. The first elevation mechanism 56 includes, for example, a support member which extends in a vertical direction and supports the first liquid receiving member 55a; and a driver configured to elevate the support member along the vertical direction. The driver is controlled by the control device 4. Therefore, the first liquid receiving member 55a is moved between a processing position where the first liquid receiving member 55a receives the processing liquid scattered from the wafer W being rotated and a retreat position retreated downwards from the processing position.

When the first liquid receiving member 55a is at the processing position, an opening is formed at an inner side of an upper end of the first liquid receiving member 55a and a flow path leading from the opening to the first drain groove 501 is formed. Also, as illustrated in FIG. 9, the inner wall member 54d includes an extended portion 54d1 which extends so as to be incline toward the peripheral portion of the rotation holder 31. When the first liquid receiving member 55a is at the retreat position, the first liquid receiving member 55a is in contact with the extended portion 54d1 of the inner wall member 54d. Thus, the opening at the inner side of the upper end is closed, so that the flow path leading to the first drain groove 501 is blocked.

The second cup 50b includes a second circumferential wall member 54b, a second liquid receiving member 55b and a second elevation mechanism 57, and is placed adjacent to the first circumferential wall member 54a of the first cup 50a.

The second circumferential wall member 54b stands up from the bottom portion 53 at an outer circumferential side of the first circumferential wall member 54a to be formed into a cylindrical shape. A space formed between the second circumferential wall member 54b and the first circumferential wall member 54a serves as a second drain groove 502 for recovering and discharging the processing liquid and the like.

The second liquid receiving member 55b is located at an outer circumferential side of the first liquid receiving member 55a and disposed above an upper surface of the second circumferential wall member 54b. The second elevation mechanism 57 includes, for example, a support member which extends in the vertical direction and supports the second liquid receiving member 55b; and a driver configured to elevate the support member along the vertical direction. The driver is controlled by the control device 4. Therefore, the second liquid receiving member 55b is moved between a processing position where the second liquid receiving member 55b receives the processing liquid scattered from the wafer W being rotated and a retreat position retreated downwards from the processing position.

When the second liquid receiving member 55b is at the processing position and the first liquid receiving member 55a is at the retreat position, an opening is formed at an inner side of an upper end of the second liquid receiving member 55b and a flow path leading from the opening to the second drain groove 502 is formed. Also, as illustrated in FIG. 9, when the second liquid receiving member 55b is at the retreat position, the second liquid receiving member 55b is in contact with the first liquid receiving member 55a. Thus, the opening at the inner side of the upper end is closed, so that the flow path leading to the second drain groove 502 is blocked. In the above description, the second liquid receiving member 55b at the retreat position is in contact with the first liquid receiving member 55a, but is not limited thereto. For example, the second liquid receiving member 55b may be in contact with the inner wall member 54*d* to close the opening at the inner side of the upper end.

The third cup 50*c* includes a third circumferential wall member 54*c* and a third liquid receiving member 55*c* and is placed adjacent to the second cup 50*b* at the opposite side to the first cup 50*a*. The third circumferential wall member 54*c* stands up from the bottom portion 53 on an outer circumferential side of the second circumferential wall member 54*b* to be formed into a cylindrical shape. Also, a space between the third circumferential wall member 54*c* and the second circumferential wall member 54*b* serves as a third drain groove 503 for recovering and discharging the processing liquid and the like.

The third liquid receiving member 55*c* is formed so as to be continuous with an upper end of the third circumferential wall member 54*c*. The third liquid receiving member 55*c* is formed to surround the periphery of the wafer W held by the rotation holder 31 and to extend to above the first liquid receiving member 55*a* and the second liquid receiving member 55 *b*.

As illustrated in FIG. 9, when both the first and second liquid receiving members 55*a* and 55*b* are at the respective retreat positions, an opening is formed at an inner side of an upper end of the third liquid receiving member 55*c* and a flow path leading from the opening to the third drain groove 503 is formed.

When the second liquid receiving member 55*b* is at the processing position, the third liquid receiving member 55*c* is in contact with the second liquid receiving member 55*b*. Thus, the opening at the inner side of the upper end is closed, so that the flow path leading to the third drain groove 503 is blocked.

Drain ports 51*a* to 51*c* are formed in the bottom portions 53 of the first to third drain grooves 501 to 503, respectively.

The drain port 51*a* is connected to a drain pipe 91*a*. The drain pipe 91*a* is an example of a first drain line for discharging the processing liquid other than the organic processing liquid. Herein, the drain pipe 91*a* is used for discharging an acidic processing liquid.

A valve 62*a* is provided at a portion of the drain pipe 91*a*. The drain pipe 91*a* is branched into a drain pipe 91*d* at a position of the valve 62*a*. The drain pipe 91*a* is an example of a first drain line for discharging the processing liquid other than the organic processing liquid and is used herein for discharging the rinse liquid. For example, a three-way valve configured to be switched between a valve closing position, a position where a discharge path is opened toward the drain pipe 91*a* and a position where the drain path is opened toward the drain pipe 91*d* can be used as the valve 62*a*.

The drain port 51*b* is connected to a drain pipe 91*b*. The drain pipe 91*b* is an example of a first drain line for discharging the processing liquid other than the organic processing liquid and is used herein for discharging an alkaline processing liquid. Further, the drain port 51*c* is connected to a drain pipe 91*c*. The drain pipe 91*c* is an example of a second drain line for discharging the organic processing liquid.

A valve 62*b* is provided at a portion of the drain pipe 91*b*. Further, a valve 62*c* is provided at a portion of the drain pipe 91*c*. The valves 62*a* to 62*c* are controlled by the control device 4.

The substrate processing device 14D performs a processing for switchably selecting any one of the drain ports 51*a* to 51*c* for the processing liquid by elevating the first liquid receiving member 55*a* of the first cup 50*a* or the second liquid receiving member 55*b* of the second cup 50*b* depending on the type of the processing liquid to be used.

For example, when processing the wafer W by discharging an etching liquid, which is the acidic processing liquid (hereinafter, referred to as "acidic processing liquid"), onto the wafer W, the control device 4 controls the driver 33 of the substrate holding mechanism 30 to open the valve 44*a* in a state where the rotation holder 31 is being rotated.

Here, the control device 4 keeps both the first cup 50*a* and the second cup 50*b* raised. That is, the control device 4 uses the first elevation mechanism 56 and the second elevation mechanism 57 to raise the first liquid receiving member 55*a* and the second liquid receiving member 55*b* to the respective processing positions. Thus, the flow path leading from the opening at the inner side of the upper end of the first liquid receiving member 55*a* to the first drain groove 501 is formed. As a result, the etching liquid supplied to the wafer W flows into the first drain groove 501.

Also, the control device 4 controls the valve 62*a* to keep the discharge path open toward the drain pipe 91*a*. Thus, the etching liquid which has flowed into the first drain groove 501 is drained to the outside of the substrate processing device 14D through the drain pipe 91*a*.

When processing the wafer W by discharging the rinse liquid onto the wafer W, the control device 4 controls the driver 33 of the substrate holding mechanism 30 to open the valve 44*b* in a state where the rotation holder 31 is being rotated.

Here, the control device 4 keeps both the first cup 50*a* and the second cup 50*b* raised. Further, the control device 4 controls the valve 62*a* to keep the discharge path open toward the drain pipe 91*d*. Thus, the rinse liquid which has flowed into the first drain groove 501 is drained to the outside of the substrate processing device 14D through the drain pipe 91*a* and the drain pipe 91*d*.

In addition, when processing the wafer W by discharging the organic solvent, which is the organic processing liquid (hereinafter, referred to as "organic processing liquid"), onto the wafer W, the control device 4 controls the driver 33 of the substrate holding mechanism 30 to open the valve 44*c* in a state where the rotation holder 31 is being rotated.

Here, the control device 4 keeps both the first cup 50*a* and the second cup 50*b* lowered. That is, the control device 4 controls the first elevation mechanism 56 and the second elevation mechanism 57 to lower the first liquid receiving member 55*a* and the second liquid receiving member 55*b* to the respective retreat positions. Thus, the flow path leading from the opening at the inner side of the upper end of the third liquid receiving member 55*c* to the third drain groove 503 is formed. As a result, the organic solvent supplied to the wafer W flows into the third drain groove 503.

Further, the control device 4 keeps the valve 62*c* open. Thus, the organic solvent which has flowed into the third drain groove 503 is drained to the outside of the substrate processing device 14D through the drain pipe 91*c*.

In addition, a source of the alkaline processing liquid (hereinafter, referred to as "alkaline processing liquid") may be connected to the liquid supply 40D. When processing the wafer W by discharging the alkaline processing liquid onto the wafer W, the control device 4 keeps only the second cup 50*b* between the first cup 50*a* and the second cup 50*b* raised. That is, the control device 4 controls the second elevation mechanism 57 to raise the second liquid receiving member 55*b* to the processing position. Thus, the flow path leading from the opening at the inner side of the upper end of the second liquid receiving member 55*b* to the second drain groove 502 is formed. As a result, the alkaline processing liquid supplied to the wafer W flows into the second drain groove 502. Also, the control device 4 keeps the valve 62b open. Thus, the alkaline processing liquid which has flowed into the second drain groove 502 is drained to the outside of the substrate processing device 14D through the drain pipe 91b.

Exhaust ports 52a, 52b and 52c are formed in the bottom portion 53, the first circumferential wall member 54a and the second circumferential wall member 54b, respectively, of the recovery cup 50. The exhaust ports 52a, 52b, and 52c are connected to a single exhaust pipe, and the exhaust pipe is branched into first to third exhaust pipes 93a to 93c at the downstream side of the exhaust path. A valve 64a is provided at the first exhaust pipe 93a, a valve 64b is provided at the second exhaust pipe 93b, and a valve 64c is provided at the third exhaust pipe 93c.

The first exhaust pipe 93a is an exhaust pipe for an acidic exhaust, the second exhaust pipe 93b is an exhaust pipe for an alkaline exhaust, and the third exhaust pipe 93c is an exhaust pipe for an organic exhaust. These exhaust pipes are switched by the control device 4 depending on the processings of the substrate processing.

For example, when performing a processing of generating the acidic exhaust, the control device 4 performs a switchover to the first exhaust pipe 93a, and, thus, the acidic exhaust is exhausted through the valve 64a. Likewise, when performing a processing of generating the alkaline exhaust, the control device 4 performs a switchover to the second exhaust pipe 93b, and, thus, the alkaline exhaust is exhausted through the valve 64b. Further, when performing a processing of generating the organic exhaust, the control device 4 performs a switchover to the third exhaust pipe 93c, and, thus, the organic exhaust is exhausted through the valve 64c.

The substrate processing device 14D configured as described above further includes a separation unit configured to separate the organic solvent from the etching liquid supplied to the wafer W (hereinafter, referred to as "used etching liquid") by the liquid supply 40D.

Figure 10:
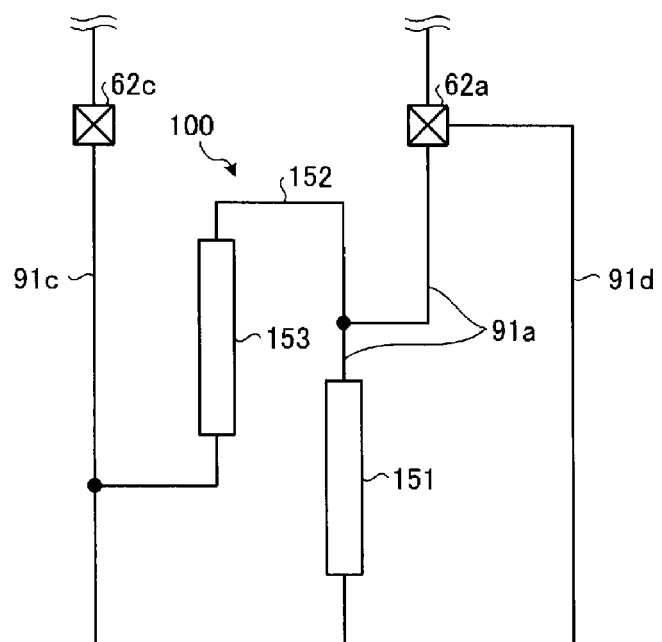
FIG. 10 is a diagram illustrating a configuration of a separation unit according to the fourth modification example.

The configuration of the separation unit will be described with reference to FIG. 10. FIG. 10 is a diagram illustrating the configuration of the separation unit according to the fourth modification example.

As illustrated in FIG. 10, a separation unit 100 includes a heater 151, a connection pipe 152, and a cooler 153.

The heater 151 is provided at the drain pipe 91a and configured to heat the used etching liquid flowing through the drain pipe 91a. For example, an electric pipe heater used by being wound around the outer circumference of the drain pipe 91a may be used as the heater 151. Since the heater 151 is provided at the drain pipe 91a so as to heat the used etching liquid flowing through the drain pipe 91a, a size increase of the separation unit 100 can be suppressed. Therefore, it is possible to provide the separation unit 100 in a relatively narrow space.

The heater 151 is controlled by the control device 4 to heat the used etching liquid flowing through the drain pipe 91a to a temperature lower than the boiling point of water and higher than the boiling point of the organic solvent. As a result, if a liquid containing water flows into the drain pipe 91a, it is possible to suppress vaporization of water along with the organic solvent by being heated with the heater 151 and to suppress introduction of the water into the drain pipe 91c through the connection pipe 152 to be described later. The organic solvent may be recovered by the manufacturer and then reused as, for example, boiler fuel. For this reason, by suppressing the introduction of the water into the drain pipe 91c, it is possible to suppress the decrease of the utility value of the organic solvent caused by the introduction of the water when the organic solvent is reused.

The connection pipe 152 is an example of a connection line, and configured to connect the drain pipe 91a and the drain pipe 91c and guide the organic solvent, which has been vaporized by being heated with the heater 151, to the drain pipe 91c.

The cooler 153 is provided at the connection pipe 152, and is configured to liquefy the organic solvent, which has been vaporized by being heated with the heater 151, in the connection pipe 152. The cooler 153 is, for example, a cooling jacket provided on the outer circumference of the drain pipe 91c and is configured to cool the vaporized organic solvent flowing through the drain pipe 91c with a coolant circulating therein.

The cooler 153 as the cooling jacket is not necessarily provided. In this case, the connection pipe 152 may be adjusted to a length sufficient to liquefy the vaporized organic solvent therein by natural heat dissipation. In this case, at least a part of the connection pipe 152 also functions as the cooler.

Figure 11:
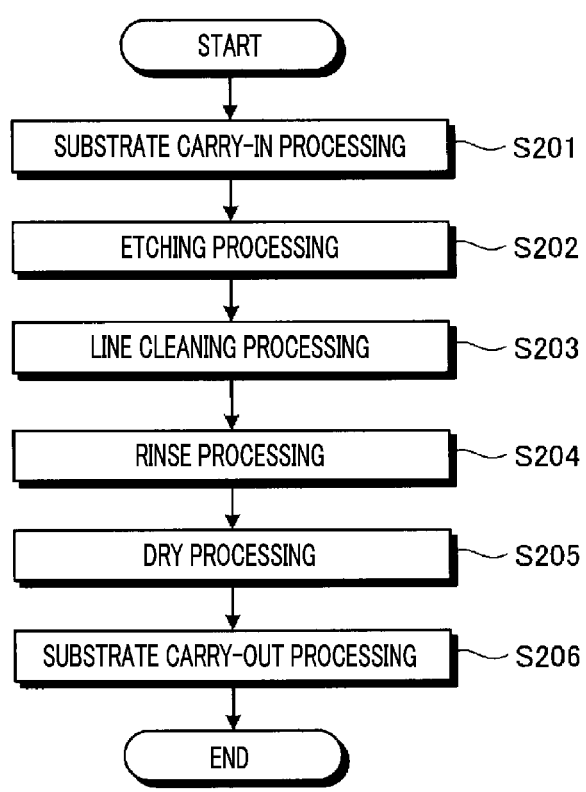
FIG. 11 is a flowchart illustrating a sequence of processings performed by the substrate processing system according to the fourth modification example.

Then, specific operations of the substrate processing device 14D will be described with reference to FIG. 11. FIG. 11 is a flowchart illustrating a sequence of processings performed by the substrate processing system according to the fourth modification example.

As illustrated in FIG. 11, in the substrate processing device 14D, a substrate carry-in processing is performed first (process S201). Thus, the wafer W is held by the rotation holder 31 and rotates together with the rotation holder 31.

Then, the substrate processing device 14D performs an etching processing (process S202). In the etching processing, the nozzle 41a of the liquid supply 40D is located above the center of the wafer W. Thereafter, the valve 44a is opened for a predetermined time period and the etching liquid is supplied to the pattern forming surface of the wafer W.

In the etching processing, the first liquid receiving member 55a and the second liquid receiving member 55b are at the respective processing positions and the flow path leading from the opening at the inner side of the upper end of the first liquid receiving member 55a to the first drain groove 501 is formed. As a result, the used etching liquid supplied to the wafer W flows into the first drain groove 501 to be drained to the outside of the substrate processing device 14D through the drain pipe 91a.

The used etching liquid flowing through the drain pipe 91a is heated by the heater 151 provided at the drain pipe 91a. Thus, the organic solvent contained in the used etching liquid is vaporized. The vaporized organic solvent flows through the connection pipe 152 to be liquefied by the cooler 153 provided at the connection pipe 152, and is drained from the drain pipe 91c to the outside of the substrate processing device 14D.

The organic processing liquid drained from the drain pipe 91c is recovered by, for example, the manufacturer and then reused as boiler fuel or the like. In the substrate processing device 14D according to the fourth modification example, the organic solvent is separated from the used etching liquid to be discharged to the drain pipe 91c. Therefore, it is possible to suppress the introduction of fluorine into the organic processing liquid discharged from the drain pipe 91c. Thus, for example, when the recovered organic processing liquid is reused, it is not necessary to perform a process of removing the fluorine atoms from the recovered organic processing liquid.

For example, as a method for removing fluorine atoms from a waste liquid containing the fluorine atoms, a method in which calcium compounds such as slaked lime and calcium chloride are added to the waste liquid to be precipitated as calcium fluoride is known. In the substrate processing device 14D according to the fourth modification example, such a process can be omitted.

Further, if a solvent for fluorine atoms is an organic solvent as in the etching liquid according to the exemplary embodiment, the removal efficiency of fluorine atoms with slaked lime or the like is lower than a case where a solvent for fluorine atoms is water. This is because the dielectric constant of the organic solvent is lower than that of water and slaked lime is difficult to dissolve in the organic solvent.

In this regard, in the substrate processing device 14D according to the fourth modification example, the etching liquid containing fluorine atoms is discharged through the drain pipe 91a for discharging a processing liquid other than the organic processing liquid. For this reason, it is possible to suppress the introduction of fluorine atom into the drain pipe 91c for discharging the organic processing liquid. Further, the organic solvent is separated from the used etching liquid discharged to the drain pipe 91a, and the separated organic solvent is discharged to the drain pipe 91c through the connection pipe 152. Thus, the organic solvent contained in the used etching liquid can be recovered as an organic liquid effluent and reused as necessary.

In addition, in the method of removing fluorine atoms with slaked lime or the like, it takes several hours for the fluorine atoms and slaked lime to react. On the other hand, in the substrate processing device 14D according to the fourth modification example, the organic solvent is separated from the used etching liquid by vaporizing the organic solvent contained in the used etching liquid, which does not need the time required for the reaction. Therefore, the organic solvent can be separated from the etching liquid in a short time compared with the method of removing fluorine atoms with slaked lime or the like.

Then, the substrate processing device 14D performs a line cleaning processing (process S203). The line cleaning processing is a processing of dissolving and discharging a salt remaining in the drain pipe 91a by allowing a cleaning liquid, which dissolves the salt containing fluorine atoms, to flow into the drain pipe 91a.

In the line cleaning processing, the nozzle 41c of the liquid supply 40D is located above the center of the wafer W. Thereafter, the valve 44c is opened for a predetermined time period and the organic solvent is supplied to the drain pipe 91a through the first drain groove 501. The organic solvent supplied to the drain pipe 91a dissolves the salt remaining in the drain pipe 91a, and the dissolved salt is drained together with the organic solvent from the drain pipe 91a to the outside of the substrate processing device 14D. The control device 4 may stop the heating by the heater 151 during the line cleaning processing. Thus, it is possible to suppress the vaporization of the organic solvent serving as the cleaning liquid.

Subsequently, the substrate processing device 14D performs a rinse processing (process S204). In the rinse processing, the nozzle 41b of the liquid supply 40D is located above the center of the wafer W. Thereafter, the valve 44b is opened for a predetermined time period and DIW, which is the rinse liquid, is supplied to the wafer W. The DIW supplied to the wafer W spreads on the pattern forming surface of the wafer W due to the centrifugal force caused by the rotation of the wafer W. As a result, the etching liquid or the organic solvent remaining on the wafer W is washed away by the DIW.

In the rinse processing, the discharge path is switched to the drain pipe 91d by the valve 62a. Thus, the DIW supplied to the wafer W is drained to the outside of the substrate processing device 14D through the drain pipe 91d.

Then, the substrate processing device 14D performs a dry processing (process S205). In the dry processing, the nozzle 41c of the liquid supply 40D is located above the center of the wafer W. Thereafter, the valve 44c is opened for a predetermined time period and the organic solvent is supplied to the wafer W. The organic solvent supplied to the wafer W spreads on the pattern forming surface of the wafer W due to the centrifugal force caused by the rotation of the wafer W. As a result, the DIW remaining on the wafer W is replaced with the organic solvent. Thereafter, the organic solvent on the wafer W is volatilized to dry the wafer W.

In the dry processing, the first liquid receiving member 55a and the second liquid receiving member 55b are at the respective retreat positions and the flow path leading from the opening at the inner side of the upper end of the third liquid receiving member 55c to the third drain groove 503 is formed. As a result, the organic solvent supplied to the wafer W flows into the third drain groove 503 to be drained to the outside of the substrate processing device 14D through the drain pipe 91c.

Subsequently, the substrate processing device 14D performs a substrate carry-out processing (process S206). In the substrate carry-out processing, the wafer W is taken out from the chamber 20 of the substrate processing device 14D by the substrate transfer device 131 (see FIG. 1). Thereafter, the wafer W is accommodated in the carrier C placed on the carrier placing section 11 via the delivery unit 122 and the substrate transfer device 121. When the substrate carry-out processing is completed, the processing for one wafer W is completed.

As described above, in the substrate processing device 14D according to the fourth modification example, the separation unit 100 can suppress the introduction of fluorine atoms into the organic liquid effluent.

Fifth Modification Example

Figure 12:
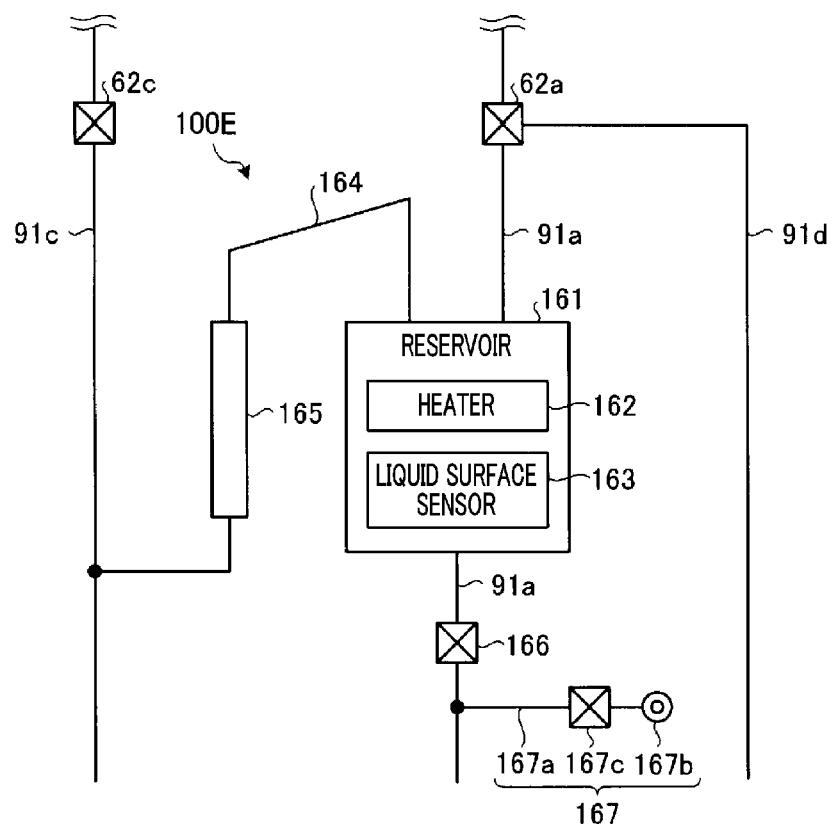
FIG. 12 is a diagram illustrating a configuration of a separation unit according to a fifth modification example.

FIG. 12 is a diagram illustrating a configuration of a separation unit according to a fifth modification example. A separation unit 100E according to the fifth modification example illustrated in FIG. 12 is configured to temporarily store the used etching liquid that flows through the drain pipe 91a, and heat the used etching liquid being stored therein to vaporize the organic solvent contained in the used etching liquid.

Specifically, as illustrated in FIG. 12, the separation unit 100E includes a reservoir 161, a heater 162, a liquid surface sensor 163, a connection pipe 164 and a cooler 165.

The reservoir 161 is a tank provided at a portion of the drain pipe 91a and stores the used etching liquid discharged to the drain pipe 91a. The heater 162 is provided in the reservoir 161 and is configured to heat the used etching liquid stored in the reservoir 161. The liquid surface sensor 163 is configured to detect a liquid surface of the liquid stored in the reservoir 161 and output the detection result to the control device 4.

The connection pipe 164 is an example of a connection line that connects the reservoir 161 and the drain pipe 91c and discharges the organic solvent vaporized by the heating with the heater 162 to the drain pipe 91c. The cooler 165 is provided at the connection pipe 164 and is configured to cool and liquefy the vaporized organic solvent flowing through the connection pipe 164.

A valve 166 is provided on the drain pipe 91a at the downstream side of the reservoir 161. Further, a coolant supply 167 is provided on the drain pipe 91a at the downstream side of the valve 166. The coolant supply 167 includes a supply pipe 167a having one end connected to the drain pipe 91a, a coolant source 167b connected to the other end of the supply pipe 167a and a valve 167c provided at a portion of the supply pipe 167a.

In the etching processing, the used etching liquid discharged to the drain pipe 91a is stored in the reservoir 161 and heated by the heater 162 in the reservoir 161. As a result, the organic solvent contained in the used etching liquid is vaporized, and the vaporized organic solvent is discharged to the drain pipe 91c through the connection pipe 164 and the cooler 165.

Since the salt containing fluorine atoms remains in the reservoir 161, a line cleaning processing is performed to remove the salt. In the line cleaning processing, the cleaning liquid (for example, water) supplied to the drain pipe 91a is stored in the reservoir 161 and thus dissolves the salt remaining in the reservoir 161.

Thereafter, when the liquid surface is detected by the liquid surface sensor 163, the control device 4 opens the valve 166 to discharge the liquid (mainly, cleaning liquid) stored in the reservoir 161. Here, the liquid stored in the reservoir 161 has been heated by the heater 162. Therefore, if the liquid is allowed to flow as it is, there is a possibility that vinyl chloride or the like used for a welded portion of the drain pipe 91a will be melted. For this reason, the control device 4 opens the valve 167c of the coolant supply 167 to supply the coolant (for example, water) from the coolant source 167b to the drain pipe 91a. Thus, it is possible to protect the drain pipe 91a.

As described above, the separation unit 100E according to the fifth modification example stores the used etching liquid in the reservoir 161 and heats the used etching liquid in the reservoir 161 to separate the organic solvent. Thus, it is possible to suppress the organic solvent from being flown into the drain pipe 91a, which is configured to discharge the processing liquid other than the organic solvent.

The separation unit 100E may be provided for each substrate processing device 14D, or may be provided for a plurality of substrate processing devices 14D.

In the fourth modification example and the fifth modification example, the used etching liquid is discharged to the drain pipe 91a. However, the used etching liquid is not necessarily discharged to the drain pipe 91a. For example, a dedicated drain pipe for discharging the used etching liquid may be provided, and the used etching liquid may be discharged to the dedicated drain pipe.

In the fourth modification example, the organic solvent, which is used as the cleaning liquid in the line cleaning processing, is also used in the dry processing. However, the cleaning liquid used in the line cleaning processing is not necessarily identical to the organic solvent used in the dry processing. For example, an organic solvent (for example, ethanol) contained in the etching liquid may be used as the cleaning liquid, and an organic solvent (for example, IPA) other than ethanol may be used in the dry processing.

In the fourth modification example and the fifth modification example, the organic solvent is separated from the etching liquid according to the exemplary embodiment. However, a target processing liquid is not limited to the etching liquid according to the exemplary embodiment, but just needs to contain the fluorine atoms and the organic solvent.

The exemplary embodiments disclosed herein are illustrative and do not limit the present disclosure. In fact, the above exemplary embodiments can be embodied in various forms. Further, the above-described exemplary embodiments may be omitted, substituted, or changed in various forms without departing from the scope and spirit of the appended claims.

EXPLANATION OF CODES

According to the present disclosure, it is possible to improve the selectivity of wet etching.

We claim:

1. A substrate processing method, comprising:
holding a substrate; and
supplying an etching liquid to the substrate held in the holding of the substrate, the etching liquid containing an etching agent configured to etch a metal-based first material and a silicon-based second material exposed on the substrate and a protection agent configured to react with the silicon-based second material between the metal-based first material and the silicon-based second material to form a protection layer on a surface of the silicon-based second material, the etching agent being a liquid which contains fluorine atoms and an organic solvent and substantially does not contain water, and the protection layer protecting the silicon-based second material from etching with the etching agent, and
separating the organic solvent from a used etching liquid serving as the etching liquid in the supplying of the etching liquid,
wherein the separating of the organic solvent includes:
discharging the used etching liquid to a first drain line configured to discharge a processing liquid; and
vaporizing the organic solvent contained in the used etching liquid by heating the used etching liquid flowing through the first drain line.

2. The substrate processing method of claim 1,
wherein the protection agent is a silylating agent.

3. The substrate processing method of claim 1,
wherein the protection agent has a direct bond between a silicon atom and a nitrogen atom.

4. The substrate processing method of claim 3,
wherein the protection agent is represented by a following Chemical Formula 1:

[Chemical Formula 1]

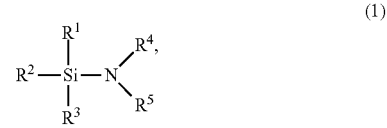

(1)

and $R^1$ to $R^5$ each independently represent an alkyl group substituted with a halogen or an unsubstituted alkyl group.

5. The substrate processing method of claim 3,
wherein the protection agent is represented by a following Chemical Formula 2:

[Chemical Formula 2]

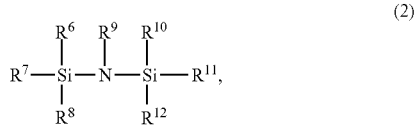

(2)

and $R^6$ to $R^{12}$ each independently represent an alkyl group or a hydrogen atom.

6. The substrate processing method of claim 3, wherein the protection agent is represented by a following Chemical Formula 3:

[Chemical Formula 3]

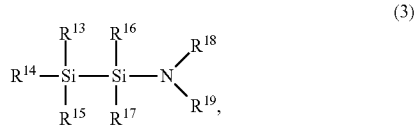

(3)

and $R^{13}$ to $R^{19}$ each independently represent an alkyl group.

7. The substrate processing method of claim 1,
wherein the first drain line is configured to discharge the processing liquid other than an organic processing liquid,
wherein the separating of the organic solvent further includes:
discharging the organic solvent, which is vaporized in the vaporizing of the organic solvent, to a second drain line through a connection line configured to connect the second drain line configured to discharge the organic processing liquid and the first drain line.

8. The substrate processing method of claim 7,
wherein a boiling point of the organic solvent is lower than a boiling point of water, and
in the vaporizing of the organic solvent, the used etching liquid is heated to a temperature lower than the boiling point of the water and higher than the boiling point of the organic solvent.

9. The substrate processing method of claim 7,
wherein the discharging of the organic solvent includes:
liquefying the organic solvent, which is vaporized in the vaporizing of the organic solvent, in the connection line.

10. The substrate processing method of claim 7, further comprising:
dissolving and discharging a salt containing the fluorine atoms and remaining in the first drain line by allowing a cleaning liquid configured to dissolve the salt to flow into the first drain line.

11. The substrate processing method of claim 1,
wherein the separating of the organic solvent includes:
discharging the used etching liquid to a first drain line configured to discharge a processing liquid other than an organic processing liquid and storing the used etching liquid in a reservoir provided at a portion of the first drain line;
vaporizing the organic solvent contained in the used etching liquid by heating the used etching liquid stored in the reservoir; and
discharging the organic solvent, which is vaporized in the vaporizing of the organic solvent, to a second drain line through a connection line configured to connect the second drain line configured to discharge the organic processing liquid and the reservoir.

12. The substrate processing method of claim 1,
wherein the etching agent is generated by dissolving a salt containing the fluorine atoms in the organic solvent.

* * * * *